United States Patent
Annunziata et al.

(10) Patent No.: US 9,614,144 B1
(45) Date of Patent: Apr. 4, 2017

(54) OTP MRAM

(71) Applicant: International Business Machines Corporation, Armonk, NY (US)

(72) Inventors: Anthony J. Annunziata, Stamford, CT (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/976,207

(22) Filed: Dec. 21, 2015

(51) Int. Cl.
 *H01L 27/22* (2006.01)
 *H01L 43/02* (2006.01)
 *H01L 43/08* (2006.01)
 *H01L 43/12* (2006.01)

(52) U.S. Cl.
 CPC ............ *H01L 43/02* (2013.01); *H01L 27/222* (2013.01); *H01L 43/08* (2013.01); *H01L 43/12* (2013.01)

(58) Field of Classification Search
 CPC ....... H01L 43/02; H01L 27/222; H01L 43/12; H01L 43/08
 See application file for complete search history.

(56) References Cited

U.S. PATENT DOCUMENTS

| | | | |
|---|---|---|---|
| 6,483,734 B1 | 11/2002 | Sharma et al. | |
| 6,717,222 B2 | 4/2004 | Zhang | |
| 6,751,149 B2 | 6/2004 | Seyyedi et al. | |
| 6,831,861 B2 | 12/2004 | Fricke et al. | |
| 7,254,058 B2 | 8/2007 | Hidaka | |
| 7,433,225 B2 | 10/2008 | Worledge | |
| 7,532,533 B2 | 5/2009 | Andre et al. | |
| 7,824,956 B2 * | 11/2010 | Schricker | G11C 13/0007 257/2 |
| 7,894,248 B2 | 2/2011 | Yu et al. | |
| 8,797,792 B2 | 8/2014 | Rao et al. | |
| 9,006,848 B2 | 4/2015 | Park | |
| 2006/0093862 A1 * | 5/2006 | Parkin | G11B 5/39 428/811.1 |
| 2009/0140310 A1 * | 6/2009 | Jang | H01L 21/28273 257/298 |
| 2010/0001270 A1 * | 1/2010 | Mieno | H01L 27/11206 257/57 |

(Continued)

OTHER PUBLICATIONS

Jan et al., "Demonstration of an MgO Based Anti-Fuse OTP Design Integrated With a Fully Functional STT-MRAM at the Mbit level," 2015 Symposium on VLSI Technology Digest of Technical Papers, pp. T164-T165 (Jun. 2015).

*Primary Examiner* — Victor A Mandala
(74) *Attorney, Agent, or Firm* — Vazken Alexanian; Michael J. Chang, LLC

(57) ABSTRACT

Techniques for forming OTP memory elements with reduced breakdown voltage are provided. In one aspect, a method of forming an OTP MRAM element includes the steps of: creating a substrate having surface topology; and forming the OTP MRAM element on the substrate over the surface topology, wherein the OTP MRAM element comprises a first magnetic metal layer and a second metal magnetic layer separated by a tunnel barrier, and wherein by forming the OTP MRAM element over the surface topology the tunnel barrier has both a first thickness T1 and second thickness T2, wherein T1 is greater than T2. A method of forming a device having both MTP MRAM and OTP MRAM elements is provided, as is an MRAM device.

24 Claims, 4 Drawing Sheets

(56) References Cited

U.S. PATENT DOCUMENTS

2012/0314473 A1* 12/2012 Chung ............... G11C 11/5678
365/96
2014/0355338 A1* 12/2014 Perniola ............ G11C 13/0004
365/163

* cited by examiner

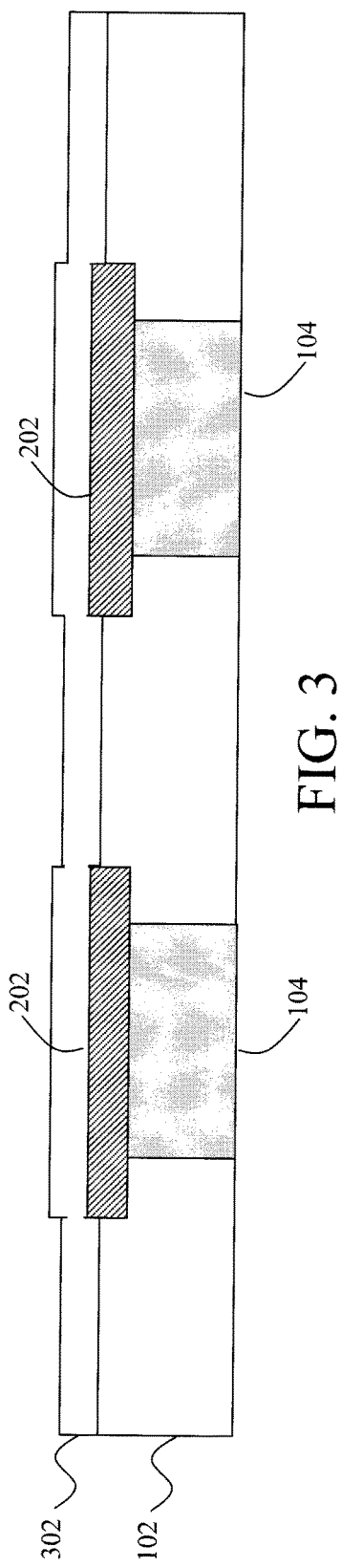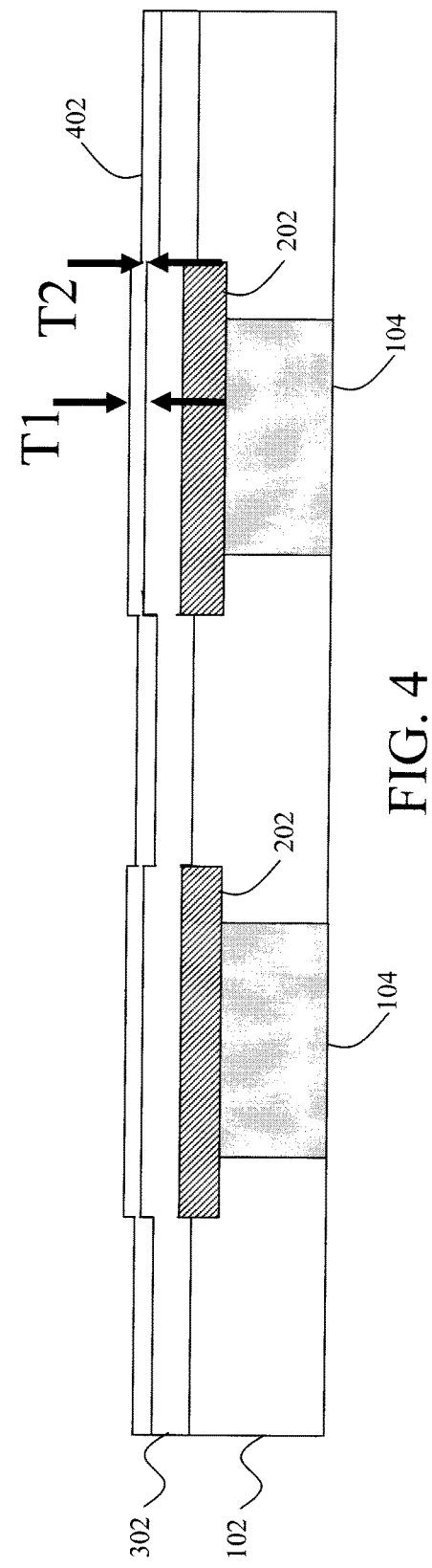

OTP MRAM

FIELD OF THE INVENTION

The present invention relates to magnetic random access memory (MRAM) magnetic tunnel junctions as one-time-programmable (OTP) memory elements, and more particularly, to techniques for forming OTP memory elements with reduced breakdown voltage using surface topology to thin the tunnel barrier.

BACKGROUND OF THE INVENTION

Magnetic tunnel junctions used in magnetic random access memory (MRAM) can also be used as one-time-programmable (OTP) memory elements. These have the advantage that they can store information even during high temperature packaging, thus allowing data stored at wafer-level test, such as redundancy addresses, to be retrieved after packaging.

The information is written to the OTP memory elements by applying a large voltage to the junction, thus breaking it down, causing it to be electrically shorted. However, MRAM bits are designed to have high breakdown voltage, to allow the main multi-time-programmable (MTP) MRAM bits to be written many times without accidentally breaking down.

It would be advantageous to use the same type of bits, processed at the same time, for both MTP and OTP applications. One way that has been proposed to do this is to make the OTP bits smaller, which decreases their breakdown voltage. See, for example, Jan et al., "Demonstration of an MgO Based Anti-Fuse OTP Design Integrated With a Fully Functional STT-MRAM at the Mbit level," 2015 Symposium on VLSI Technology Digest of Technical Papers, pp. T164-T165 (June 2015). However, this is only a small effect, and requires printing the devices so small that there will be manufacturing control issues.

Thus, alternative methods for co-processing MTP and OTP MRAM bits would be desirable.

SUMMARY OF THE INVENTION

The present invention provides techniques for forming one-time-programmable (OTP) memory elements with reduced breakdown voltage using surface topology to thin the tunnel barrier. In one aspect of the invention, a method of forming an OTP magnetic random access memory (MRAM) element is provided. The method includes the steps of: creating a substrate having surface topology; forming the OTP MRAM element on the substrate over the surface topology, wherein the OTP MRAM element comprises a first magnetic metal layer and a second metal magnetic layer separated by a tunnel barrier, and wherein by forming the OTP MRAM element over the surface topology the tunnel barrier has both a first thickness T1 and second thickness T2, wherein T1 is greater than T2.

In another aspect of the invention, a method of forming a device having both multi-time-programmable (MTP) MRAM and OTP MRAM elements is provided. The method includes the steps of: creating a substrate having at least one smooth region and at least one region having surface topology; forming the MTP MRAM elements on the smooth region of the substrate; forming the OTP MRAM elements on the region of the substrate having surface topology, wherein the MTP MRAM and OTP MRAM elements each comprise a first magnetic metal layer and a second metal magnetic layer separated by a tunnel barrier, and wherein by forming the OTP MRAM elements on the region of the substrate having surface topology the tunnel barrier in the OTP MRAM elements has both a first thickness T1 and second thickness T2, wherein T1 is greater than T2.

In yet another aspect of the invention, an MRAM device is provided. The MRAM device includes a substrate having surface topology; and at least one OTP MRAM element on the substrate over the surface topology, wherein the OTP MRAM element comprises a first magnetic metal layer and a second metal magnetic layer separated by a tunnel barrier, and wherein by having the OTP MRAM element over the surface topology the tunnel barrier has both a first thickness T1 and second thickness T2, wherein T1 is greater than T2.

A more complete understanding of the present invention, as well as further features and advantages of the present invention, will be obtained by reference to the following detailed description and drawings.

BRIEF DESCRIPTION OF THE DRAWINGS

FIG. 3 is a cross-sectional diagram illustrating a first magnetic metal layer having been formed on the dielectric substrate over the landing pads according to an embodiment of the present invention;

FIG. 4 is a cross-sectional diagram illustrating a tunnel barrier having been formed on the magnetic metal layer according to an embodiment of the present invention;

DETAILED DESCRIPTION OF PREFERRED EMBODIMENTS

Provided herein are techniques for forming magnetic random access memory (MRAM) one-time-programmable (OTP) memory elements. In general, an MRAM bit (also referred to herein as an element) includes a thin tunnel barrier layer sandwiched between two magnetic metal layers. Being thin (e.g., about 1 nanometer (nm)), electrons can tunnel through the tunnel barrier. Writing information to OTP MRAM bits involves applying a large voltage to the bits to permanently damage the tunnel barrier. As a result, the magnetic metal layers become shorted through the holes in the tunnel barrier. A high resistance bit, meaning that the tunnel barrier has not been broken down, registers as a logic 1, and a low resistance bit, meaning that the magnetic metal layers are shorted together, registers as a logic 0.

The voltage needed to breakdown the tunnel barrier in the OTP MRAM bits is an important consideration. There is a limit to the amount of chip voltage that can be reasonably generated, especially in the field. Thus, it is advantageous to be able to weaken the tunnel barrier in OTP MRAM thereby making it easier to break down. As highlighted above, another design consideration is how to integrate the OTP MRAM with main multi-time-programmable (MTP) MRAM bits on the same chip. Further to that point, it would be desirable to be able to produce the OTP and MTP bits at the same time, via the process. Thus, ideally, the process to integrate the OTP technology into MTP MRAM does not introduce additional steps. Advantageously, the present techniques provide an effective solution for integrating OTP and MTP MRAM bits in the same chip using a single process, and wherein the breakdown voltage of the OTP MRAM bits is significantly reduced as compared to the MTP bits.

Namely, as will be described in detail below, the present techniques involve forming the OTP memory elements on a surface having topography, such as at the seam between a landing pad (on which the bits are formed) and the surrounding dielectric. As a result, the tunnel barrier will be thinner over the seam, thereby reducing the breakdown voltage.

Advantageously, the present techniques can be implemented in conjunction with the fabrication of MTP MRAM bits, thus permitting the effective co-processing of OTP and MTP bits. For example, as will be described in detail below, the MTP can be aligned to land entirely on the pad which is a smooth region without topology, while the OTP is aligned to land on the seam between the pad and the dielectric which has topology. Thus one single process can be used to form both OTP and MTP bits just with selective placement of the bits.

A first exemplary embodiment of the present techniques is now described by way of reference to FIGS. 1-6. For illustrative purposes only, the figures will depict the formation of one OTP bit and one MTP bit. However, the same process applies whether one is forming multiple or single OTP and/MTP bits.

Figure 1:
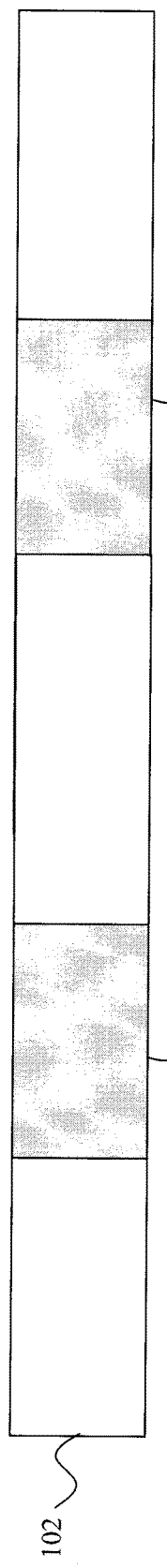
FIG. 1 is a cross-sectional diagram illustrating a dielectric substrate in which one or more vias have been formed according to an embodiment of the present invention.

As shown in FIG. 1, the process begins with a dielectric substrate 102 (e.g., an oxide substrate) in which one or more vias 104 have been formed. As will be described in detail below, one of the two magnetic metal layers is a fixed magnetic layer and the other is a free magnetic layer. In MTP MRAM, data is written to the bits based on the orientation of the free magnetic layer with respect to the fixed magnetic layer. The magnetic metal layers are oriented as a stack with the tunnel barrier in between. Either the top or the bottom magnetic metal layer in the stack can be the free magnetic layer or the fixed magnetic layer. However, ideally, the free magnetic layer is on the bottom. Thus, according to an exemplary embodiment, the fixed magnetic layer will be the bottom magnetic layer and the free magnetic layer will be the top magnetic layer, the two being separated by the tunnel barrier. In that case, vias 104 will provide access to the (bottom) fixed layer of each MRAM bit. Standard techniques may be employed to form vias 104 in dielectric substrate 102.

Figure 2:
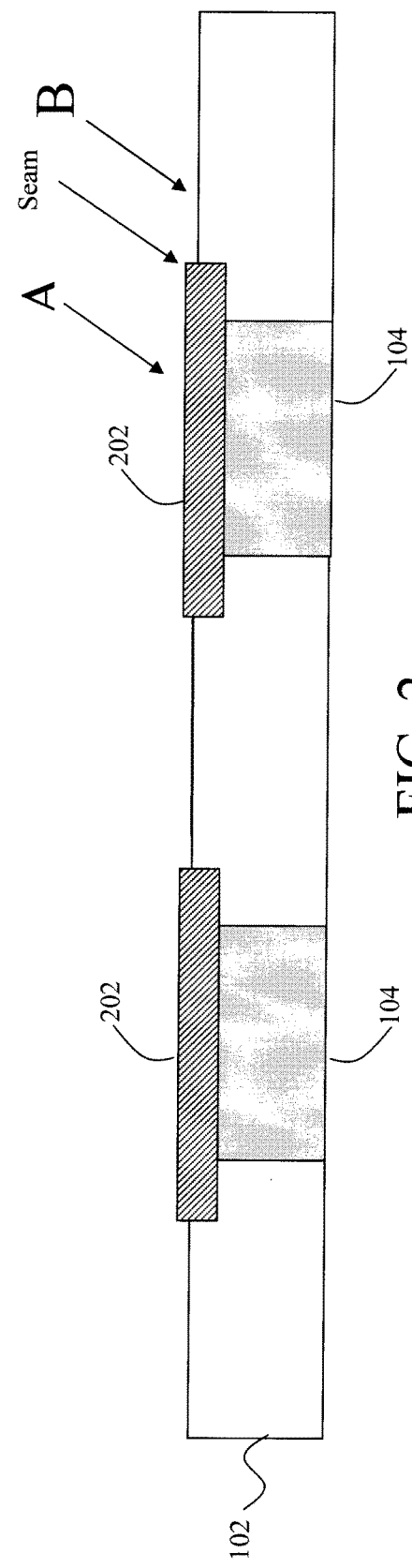
FIG. 2 is a cross-sectional diagram illustrating landing pads having been formed on the dielectric substrate in contact with the vias, wherein the landing pads are used to create topography on the surface of the dielectric substrate with a top surface of the landing pads being non-coplanar with a top surface of the dielectric substrate according to an embodiment of the present invention.
Figure 5:
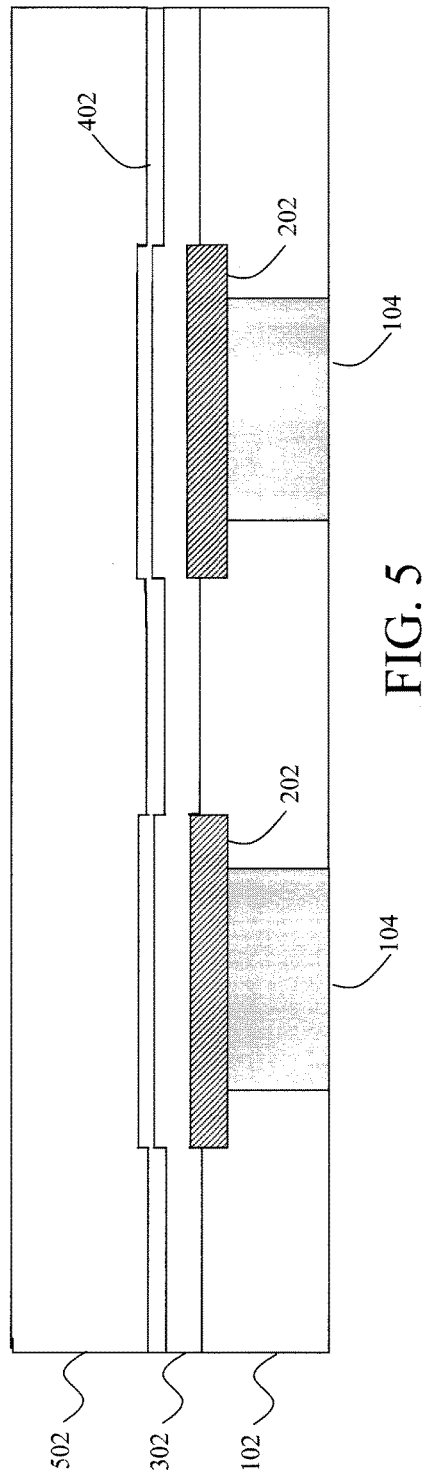
FIG. 5 is a cross-sectional diagram illustrating a second magnetic metal layer having been formed on the tunnel barrier according to an embodiment of the present invention.
Figure 6:
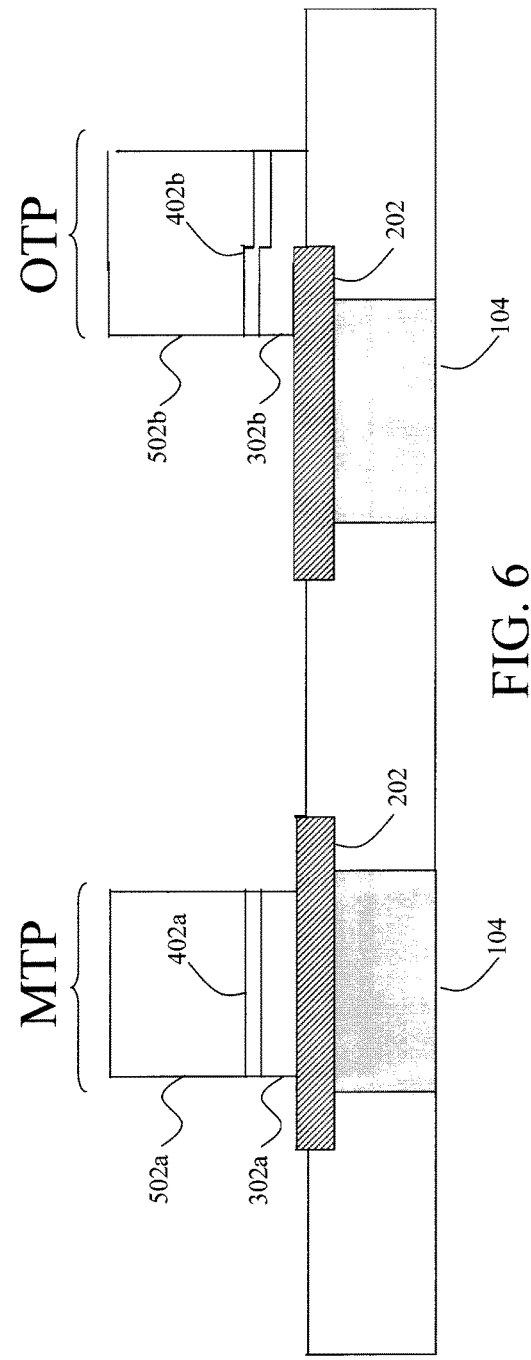
FIG. 6 is a cross-sectional diagram illustrating the first magnetic metal layer, the tunnel barrier, and the second magnetic memory layer having been patterned into individual bits according to an embodiment of the present invention.

Next, one or more landing pads 202 are formed on the dielectric substrate 102 in contact with the vias 104. See FIG. 2. The landing pads 202 may be formed from a suitable contact metal such as tantalum nitride (TaN). In this example, the landing pads 202 are used to create select regions of topography on the surface of the dielectric substrate 102. Namely, as shown in FIG. 2, a top surface of the landing pads 202 (i.e., surface A) is not coplanar with a top surface of the dielectric substrate 102 (i.e., surface B)—i.e., there is a step between these two surfaces. There is a seam at the junction between the surface A of the landing pad 202 and the surface B of the dielectric substrate 102. As highlighted above, it is on this seam that the OTP MRAM bits can be formed. Namely, as will be described in detail below, the OTP MRAM bits can be aligned with this seam such that each OTP MRAM bit is formed contacting both the surface A and the surface B. The topography at this seam will translate to the various layers of the OTP MRAM bit, including the tunnel barrier. As a result, the tunnel barrier of the OTP MRAM bits will be thinner over the seam. By thinning the barrier layer, the breakdown voltage of the present OTP MRAM bits can be reduced. By contrast, other regions of the substrate (such as directly over the landing pads) are smooth, i.e., without topography. The (e.g., MTP) elements formed in those smooth regions will have uniform barrier layer thickness.

This stepped topography between the surface of the dielectric substrate 102 and the landing pads 202 can be created during fabrication of the landing pads 202. For instance, the landing pads can be formed by depositing a metal(s) into a pattern on the surface of the dielectric substrate 102. Excess metal can be removed by polishing (e.g., using chemical mechanical polishing or CMP). Depending on the selectivity of the polishing process, the metal might be underpolished or overpolished with respect to the dielectric substrate 102. The former is what is shown in the figures. Namely, when underpolished, the top surface of the landing pads 202 will be slightly higher than the top surface of the dielectric substrate 102, creating the non-coplanar stepped surface. Alternatively, when overpolished, the top surface of the landing pads 202 will be slightly lower than the top surface of the dielectric substrate 102, also creating the non-coplanar stepped surface. It is notable that either scenario might be used to create the non-coplanar stepped surface in accordance with the present techniques. Thus, while the figures depict a landing pad top surface as being higher than the dielectric substrate top surface, the opposite (i.e., landing pads recessed below the top surface of the dielectric substrate) can also be implemented in accordance with the present techniques in the same manner. What is important is that a non-coplanar surface (i.e., a surface with topography) is provided on which the OTP MRAM bits can be formed.

In this example, one OTP MRAM bit and one MTP MRAM bit will be formed on the dielectric substrate 102. The placement of these bits on adjacent locations on the substrate is done merely for ease of depicting the process. The present techniques can be implemented to form OTP and MTP MRAM bits at any locations on a wafer.

To begin forming the MRAM bits, a first magnetic metal layer 302 is formed on the dielectric substrate 102 over the landing pads 202. See FIG. 3. According to an exemplary embodiment, the first magnetic metal layer 302 will serve as a fixed magnetic layer in the MRAM bits. By way of example only, the magnetic metal layer 302 contains a ferromagnetic material, including, but not limited to, one or more of a CoFeB alloy and layers containing one or more of Ni, Fe, and Cobalt (Co). Further, the magnetic memory layer might be composed of a single layer of the foregoing materials or, alternatively, might have a multiple layer structure. See, for example, U.S. Pat. No. 7,433,225 issued to Daniel C. Worledge, entitled "Scalable Magnetic Random Access Memory Device" (hereinafter "U.S. Pat. No. 7,433,225"), the contents of which are incorporated by reference as if fully set forth herein. For example, as provided in U.S. Pat. No. 7,433,225, the fixed magnetic layer can include multiple (anti-parallel-coupled) magnetic layers each containing Ni, Fe and/or Co. As shown in FIG. 3, the magnetic metal layer 302 conforms to the topography on the dielectric substrate 102 including that caused by the presence of the seam between the non-coplanar surfaces of landing pads 202 the dielectric substrate 102.

Next, a tunnel barrier 402 is formed on the magnetic metal layer 302. See FIG. 4. Suitable tunnel barrier materials include, but are not limited to, aluminum oxide (AlOx) and/or magnesium oxide (MgO). As shown in FIG. 4, the topography from the dielectric substrate 102 is translated through the magnetic metal layer 302 to the tunnel barrier 402. Notably, the tunnel barrier 402 is thinner wherever it passes over a seam. This occurs because the deposition of the thin tunnel barrier over the step causes the tunnel barrier to bend over the step, which introduces a shorter path for tunneling if the electrons tunnel through at an angle, instead of vertically through the tunnel barrier. For instance, on planar surfaces (such as directly over a landing pad 202) the tunnel barrier 402 has a first thickness T1, whereas over a non-coplanar surface (such as over a seam) the tunnel barrier 402 has a second thickness T2, wherein T1 is greater than T2. For instance, T1 may be 1.2 nm and T2 may be 0.8 nm (see below). It is by way of this reduced thickness T2 that the OTP MRAM bits will be configured to have a reduced breakdown voltage (as compared to the MTP MRAM bits). By way of example only, T1 can be from about 1 nm to about 2 nm, and ranges therebetween, while T2 is reduced to from about 0.5 nm to about 1 nm, and ranges therebetween.

A second magnetic metal layer 502 is then formed on the tunnel barrier 402. See FIG. 5. According to an exemplary embodiment, the magnetic metal layer 502 will serve as a free magnetic layer in the MRAM bits. By way of example only, the magnetic metal layer 502 contains a ferromagnetic material, including, but not limited to, one or more of a CoFeB alloy and layers containing one or more of Ni, Fe, and Co. Further, like the magnetic metal layer 302 magnetic memory layer 502 might be composed of a single layer of the foregoing materials or, alternatively, might have a multiple layer structure. See, for example, U.S. Pat. No. 7,433,225. For example, as provided in U.S. Pat. No. 7,433,225, the free magnetic layer can include multiple (anti-parallel-coupled) magnetic layers each containing Ni, Fe and/or Co. As shown in FIG. 3, the magnetic metal layer 302 can be made thicker than magnetic metal layer 302.

The magnetic metal layer 302, tunnel barrier 402, and magnetic memory layer 502 are then patterned into individual MRAM bits. See FIG. 6. The patterning can be carried out using, e.g., reactive ion etching (RIE) or ion beam etching (IBE). In the figures, the patterned magnetic metal layers/tunnel barrier are now given the reference numerals a, b, etc. corresponding to the individual bits. Here, the OTP MRAM bit is patterned such that it lands on the seam (i.e., such that one portion of the OTP MRAM bit sits on a landing pad 202 and another portion sits on the dielectric substrate 102, wherein the landing pads 202 and the dielectric substrate 102 are non-coplanar. As a result, the tunnel barrier will be thinner over the seam. On the other hand, the MTP MRAM bit is patterned to land (solely) on one of the landing pads (i.e., on a surface without any topography). The tunnel barrier in the MTP MRAM bits thus will have a uniform thickness.

The use of non-coplanar landing pads and dielectric substrate as in the example above is only one way contemplated herein for creating surface topology. According to another exemplary embodiment, a metal liner is included (between the dielectric substrate and the landing pads) and that metal liner is used to create the surface topology. See, e.g., FIGS. 7-10. In FIGS. 7-10 only the OTP MRAM bit is depicted. However, the process proceeds in the same manner (as described above) when OTP and MTP MRAM bits are being formed at the same time. Like structures with those of the above example are numbered alike in FIGS. 7-10.

Figure 7:
FIG. 7 is a cross-sectional diagram illustrating, according to an alternative embodiment, a dielectric substrate having one or more vias, and a landing pad pattern lined with a metal liner according to an embodiment of the present invention.
Figure 8:
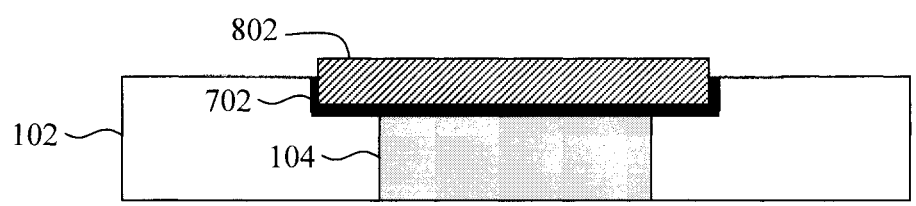
FIG. 8 is a cross-sectional diagram illustrating the pattern having been filled with a contact metal to form landing pads according to an embodiment of the present invention.
Figure 9:
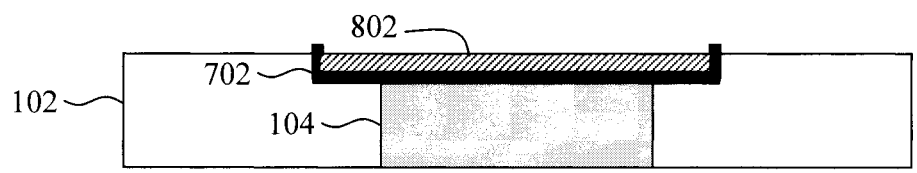
FIG. 9 is a cross-sectional diagram illustrating excess contact metal having been removed using polishing which results in the metal liner protruding above the surface of the dielectric substrate creating topology according to an embodiment of the present invention.

As shown in FIG. 7, the process begins in the same general manner as the above example with a dielectric substrate 102 in which one or more vias 104 have been formed. See FIG. 7. Landing pads will be formed on the dielectric substrate 102 over the vias 104. However, prior to forming the landing pads, a liner 702 is first deposited on the dielectric substrate 102. The liner 702 will separate the landing pads from the dielectric substrate 102 (and from the via 104). Namely, as provided above, a pattern for the landing pads is first created on the surface of the dielectric substrate 102. Here, the pattern is then lined (with liner 702). Suitable liner materials include, but are not limited to, tantalum (Ta). The pattern is then filled with a contact metal (e.g., Cu) onto the liner 702 and then capped with TaN to form the landing pads 802. See FIG. 8.

A polishing process, such as CMP, can be used to remove excess contact metal. During this polishing step, the liner 702 may polish slower than the landing pad metal/dielectric. As a result, post-polishing, the liner 702 will protrude above the surface of the landing pads 802/dielectric substrate 102. See FIG. 9. These protruding portions of the liner are what create the present surface topography in this example.

Figure 10:
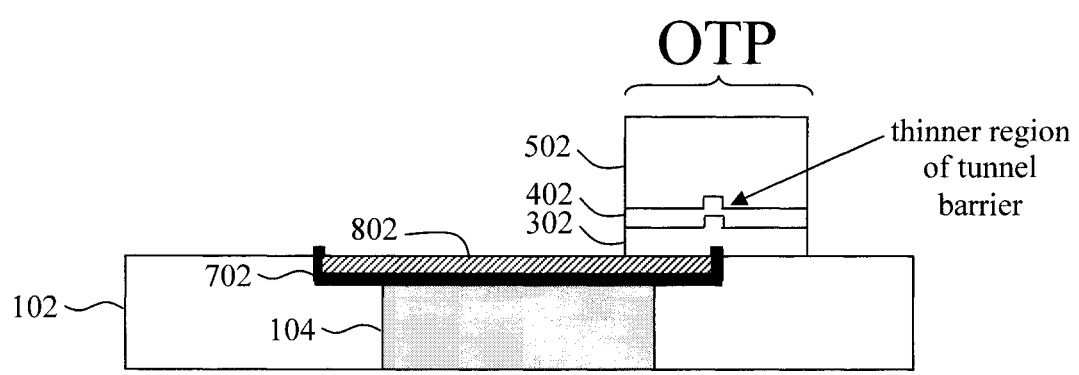
FIG. 10 is a cross-sectional diagram illustrating an OTP MRAM bit having been formed over the protruding metal liner, resulting in a thinned tunnel barrier according to an embodiment of the present invention.

Namely, in the same manner as above, the OTP MRAM bits can be formed with one portion thereof landing on the landing pad, and another portion thereof landing on the dielectric substrate 102. The protruding liner 702 will be present at the interface of the landing pads and the dielectric. This topology will cause a thinner tunnel barrier to be formed at this interface. For instance, as shown in FIG. 10, an OTP MRAM has been formed over this interface. The OTP MRAM bit includes a magnetic metal layer 302 (e.g., fixed magnetic layer) and a magnetic metal layer 502 (e.g., a free magnetic layer) separated by a tunnel barrier 402. Suitable materials and methods for forming the magnetic memory and tunnel barrier layers were described above.

As a result of the OTP MRAM bit having been formed over the protruding liner 702, this surface topology will translate to the various layers of the bit. Most notably, the surface topology will be transferred to the tunnel barrier 402, resulting in the tunnel barrier having a thinner region. As described above, thinning the tunnel barrier decreases the breakdown voltage.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a one-time-programmable (OTP) magnetic random access memory (MRAM) element, the method comprising the steps of:
   creating a substrate having surface topology;
   forming the OTP MRAM element on the substrate over the surface topology, wherein the OTP MRAM element comprises a first magnetic metal layer and a second metal magnetic layer separated by a tunnel barrier, and wherein by forming the OTP MRAM element over the surface topology the tunnel barrier has both a first thickness T1 and second thickness T2, wherein T1 is greater than T2.

2. The method of claim 1, wherein the surface topology comprises a first surface and a second surface, and wherein the first surface and the second surface are non-coplanar surfaces.

3. The method of claim 2, wherein the surface topology comprises a seam between the first surface and the second surface.

4. The method of claim 3, wherein the OTP MRAM element is formed on the seam, such that the OTP MRAM element is present on both the first surface and on the second surface.

5. The method of claim 1, wherein the substrate comprises a dielectric substrate.

6. The method of claim 1, further comprising the step of:
   forming at least one landing pad on a surface of the substrate, wherein a surface of the landing pad and a surface of the substrate are non-coplanar surfaces thereby creating the surface topology on the substrate.

7. The method of claim 6, further comprising the step of:
   using polishing to create the non-coplanar surfaces.

8. The method of claim 1, further comprising the step of:
   forming at least one landing pad on a surface of the substrate, wherein the landing pad is separated from the substrate by a liner.

9. The method of claim 8, wherein the liner comprises a metal liner.

10. The method of claim 8, wherein the liner protrudes above the surface of the substrate thereby creating the surface topology on the substrate.

11. The method of claim 8, further comprising the step of:
   using polishing to make the liner protrude above the surface of the substrate.

12. A method of forming a device having both multi-time-programmable (MTP) MRAM and OTP MRAM elements, the method comprising the steps of:
   creating a substrate having at least one smooth region and at least one region having surface topology;
   forming the MTP MRAM elements on the smooth region of the substrate;
   forming the OTP MRAM elements on the region of the substrate having surface topology,
   wherein the MTP MRAM and OTP MRAM elements each comprise a first magnetic metal layer and a second metal magnetic layer separated by a tunnel barrier, and wherein by forming the OTP MRAM elements on the region of the substrate having surface topology the tunnel barrier in the OTP MRAM elements has both a first thickness T1 and second thickness T2, wherein T1 is greater than T2.

13. The method of claim 12, wherein the surface topology comprises a first surface and a second surface, and wherein the first surface and the second surface are non-coplanar surfaces.

14. The method of claim 13, wherein the surface topology comprises a seam between the first surface and the second surface.

15. The method of claim 14, wherein the OTP MRAM elements are formed on the seam, such that the OTP MRAM elements are present on both the first surface and on the second surface.

16. The method of claim 12, further comprising the step of:
   forming at least one landing pad on a surface of the substrate, wherein a surface of the landing pad and a surface of the substrate are non-coplanar surfaces thereby creating the region having surface topology.

17. The method of claim 16, wherein the surface of the landing pad comprises the smooth region of the substrate.

18. The method of claim 12, further comprising the step of:
   forming at least one landing pad on a surface of the substrate, wherein the landing pad is separated from the substrate by a liner, and wherein the liner protrudes above the surface of the substrate thereby creating the region having surface topology.

19. An MRAM device, comprising:
   a substrate having surface topology;
   at least one OTP MRAM element on the substrate over the surface topology, wherein the OTP MRAM element comprises a first magnetic metal layer and a second metal magnetic layer separated by a tunnel barrier, and wherein by having the OTP MRAM element over the surface topology the tunnel barrier has both a first thickness T1 and second thickness T2, wherein T1 is greater than T2.

20. The MRAM device of claim 19, wherein the surface topology comprises a first surface, a second surface, and a seam therebetween, and wherein the first surface and the second surface are non-coplanar surfaces.

21. The MRAM device of claim 20, wherein the OTP MRAM element is formed on the seam, such that the OTP MRAM element is present on both the first surface and on the second surface.

22. The MRAM device of claim 19, further comprising:
   at least one landing pad on a surface of the substrate, wherein a surface of the landing pad and a surface of the substrate are non-coplanar surfaces thereby creating the surface topology on the substrate.

23. The MRAM device of claim 22, wherein the landing pad is separated from the substrate by a liner, and wherein the liner protrudes above the surface of the substrate thereby creating the surface topology on the substrate.

24. The MRAM device of claim 19, further comprising:
   an MTP MRAM element on the landing pad.

* * * * *